(12) United States Patent
Duarte et al.

(10) Patent No.: US 10,634,309 B2
(45) Date of Patent: Apr. 28, 2020

(54) MOTOR VEHICLE LIGHTING MODULE WITH COOLING MEMBER

(71) Applicant: VALEO VISION, Bobigny (FR)

(72) Inventors: Marc Duarte, Bobigny (FR); Brahim Elhachir, Bobigny (FR); Stephane Andre, Bobigny (FR); Christian Texier, Bobigny (FR)

(73) Assignee: VALEO VISION, Bobigny (FR)

(*) Notice: Subject to any disclaimer, the term of this patent is extended or adjusted under 35 U.S.C. 154(b) by 231 days.

(21) Appl. No.: 15/694,248

(22) Filed: Sep. 1, 2017

(65) Prior Publication Data

US 2018/0058657 A1    Mar. 1, 2018

(30) Foreign Application Priority Data

Sep. 1, 2016   (FR) ...................................... 16 58126

(51) Int. Cl.
| | | |
|---|---|---|
| *F21S 45/47* | (2018.01) | |
| *F21S 45/49* | (2018.01) | |
| *F21V 29/74* | (2015.01) | |
| *F28F 3/02* | (2006.01) | |
| *F21S 41/141* | (2018.01) | |
| *F21V 29/70* | (2015.01) | |
| *F21S 41/148* | (2018.01) | |
| *F21V 29/89* | (2015.01) | |
| *F21S 41/30* | (2018.01) | |
| *F21S 41/20* | (2018.01) | |

(Continued)

(52) U.S. Cl.
CPC ............. *F21S 45/47* (2018.01); *F21S 41/141* (2018.01); *F21S 41/148* (2018.01); *F21S 41/285* (2018.01); *F21S 41/30* (2018.01); *F21S 45/49* (2018.01); *F21V 29/70* (2015.01); *F21V 29/74* (2015.01); *F21V 29/89* (2015.01); *F28F 3/025* (2013.01); *F21Y 2115/10* (2016.08); *H01L 23/3672* (2013.01)

(58) Field of Classification Search
CPC . F21S 45/47; F21S 45/48; F21S 45/49; F21V 29/74; F28F 3/025
See application file for complete search history.

(56) References Cited

U.S. PATENT DOCUMENTS

| 2014/0153248 A1 | 6/2014 | Yeh |
| 2015/0377473 A1 | 12/2015 | Ha et al. |
| 2017/0219182 A1* | 8/2017 | Duarte .................... F21V 29/74 |

FOREIGN PATENT DOCUMENTS

| EP | 2 636 981 A1 | 9/2013 |
| WO | WO 2016/030156 A1 | 3/2016 |

OTHER PUBLICATIONS

French Preliminary Search Report dated Jan. 25, 2017 in French Application 16 58126 filed on Sep. 1, 2016 (with English Translation of Categories of Cited Documents).

* cited by examiner

*Primary Examiner* — Suezu Ellis
(74) *Attorney, Agent, or Firm* — Oblon, McClelland, Maier & Neustadt, L.L.P.

(57) ABSTRACT

A lighting module including a base, on which there are mounted at least one light source and a cooling member including at least two fins joined together elastically and each having at least one heat-sink wall and a connection portion thermally connected to the base by a thermal interface. The module includes at least one stop piece able to come into contact with part of a fin when this fin is brought elastically closer to another fin.

19 Claims, 4 Drawing Sheets

(51) Int. Cl.
*H01L 23/367* (2006.01)
*F21Y 115/10* (2016.01)

MOTOR VEHICLE LIGHTING MODULE WITH COOLING MEMBER

The invention falls within the field of lighting and/or signaling devices for motor vehicles and relates more particularly to the lighting modules intended to be mounted in a vehicle headlamp and to the cooling members associated with these modules.

Motor vehicle headlamps are usually made up of a housing which is closed by a transparent wall through which one or more beams of light emerge. This housing therefore forms a space in which to house at least one lighting module, chiefly comprising a light source and an optical system for shaping the light generated by the light source so that the headlamp can emit the beam of light.

In recent years, the use of light sources made up of at least one light emitting diode, or LED as it is known for short, has become more widespread because of the low energy consumption, small size and quality of the lighting obtained with these light emitting diodes. However, the use of light emitting diodes has the disadvantage of producing heat, whereas heat proves to be detrimental to the correct operation of the light emitting diodes. Specifically, the higher the temperature of a light emitting diode becomes, the more the light flux it is capable of emitting decreases.

It will be appreciated that this disadvantage is all the worse when the lighting module is designed to generate a beam that needs a high light intensity, such as for low-beam headlamps, high-beam headlamps or foglamps, the number of light emitting diodes and/or the power required for their operation then being high. Because of the high increase in temperature of the lighting module while it is being used, it is necessary to reduce the temperature in the lighting module in order to avoid any malfunctioning of the light source or sources which is inherent to excessive heat.

In order to produce effective cooling of the light emitting diodes it is known practice to use a cooling member which comprises, on the one hand, a fixing part for fixing to a base itself bearing the light emitting diodes, and, on the other hand, a heat-dissipating heat sink part formed notably of fins mounted in series elastically with respect to one another and bearing the fixing part, the separation of the fins having a bearing on the dimension of the fixing part. The fixing part also has the function of transferring heat energy by conduction from the base to the heat-sink part of the cooling member.

The fixing part is substantially planar so that it can be held flat against a face of the base and comprises connection portions forming the surface for bearing against the base, as well as indexing means, for example orifices, arranged at the lateral ends of this fixing part and configured to collaborate with complementary indexing means, for example posts, borne by the base.

The connection portions allow the cooling member to be fixed in position using adhesive sandwiched between the base that bears the light emitting diodes and the connection portions, and this adhesive allowing the cooling member to be immobilized in the position defined by the collaboration of the indexing means.

In practice, in order to take account of the manufacturing tolerances which may cause misalignment of the indexing means, the separation of the indexing means of the cooling member is designed to be greater than the separation of the posts borne by the base, given that it is easier to compress the bent sheet metal that makes up the cooling member in order to cause the indexing means borne by the sheet metal to come into correspondence with the posts borne by the base than it is to have to move the fins of the cooling member apart. Thus, during assembly, pressure is applied to the heat-sink part to move the fins laterally closer together so that the indexing means arranged at the lateral ends of the cooling member come closer together. This pressure may cause an overlapping of the connection portions one over the other, and this may result in plastic deformation of one of the connection portions.

It will be appreciated that plastic deformation of a connection portion as a result of it being overlapped or underlapped with another connection portion will lead to a lack of flatness of the fixing part as a whole and therefore to a variable space between the base and each of the connection portions that has to be filled with glue. Either there will not be enough glue to fill this space that is larger than is theoretically provided for and the fixing of the cooling member will then be compromised, or additional glue will be deposited to fill the hole and the layer of glue used to fix the cooling member in position will then not be uniform. This surplus glue and the uneven layer that results from it implies a reduction in the efficiency of the exchange of heat between the base and the heat sink part, because of the insufficient heat dissipating properties of the glue and/or an exchange of heat that is not uniform.

It is an objective of the present invention to overcome the disadvantages described hereinabove by designing a lighting module that notably has a cooling member that allows this module to be cooled more effectively.

In this context, the present invention relates to a lighting module comprising a base, on which there are mounted at least one light source and a cooling member comprising at least two fins joined together elastically and each comprising at least one heat-sink wall and a connection portion thermally connected to the base by a thermal interface, and notably by glue. According to the invention, the module comprises at least one stop piece able to come into contact with part of a fin when this fin is brought elastically closer to another fin.

What is to be understood by "able to come into contact" is that, when the lighting module is in a resting position, which means to say without pressure being exerted on this module by an operator, the stop piece is not in contact with the fin but faces it, and that it is this pressure, that causes the fins to move elastically closer together, that brings the stop piece and the fin into contact and which thus acts as a limit stop preventing overlapping of the connection portions respectively borne by the fins.

According to a first series of features, considered alone or in combination, and specific to the creation of the cooling member, provision may be made that:

the cooling member is formed of a single bent sheet metal;
 the cooling member is made of plastic, notably molded plastic;
 the at least two fins are joined together elastically by a first bend;
 the first bend joining one fin to another fin prolongs an end of a heat-sink wall of each of these fins;
 the first bend joining two fins together extends at a distal end of the cooling member, namely at an opposite end to the connection portions and to the base when the cooling member is mounted on the base;
 the fins comprise two heat-sink walls;
 the heat-sink walls of one and the same fin are joined together by a second bend, the first and second bends being arranged at opposite ends of the cooling member;

the second bend between two heat-sink walls extends in line with at least one connection portion borne by one of the fins;

the heat-sink walls are mutually parallel;

each connection portion of a fin prolongs a heat-sink wall of this fin by means of a bend;

the heat-sink wall and the connection portion are substantially orthogonal;

the connection portions are arranged substantially in the same plane;

the second bend joining two fins is orthogonal to the bend or bends connecting heat-sink wall and connection portion.

According to another series of features, considered alone or in combination, and which can potentially be combined with one and/or another of the features of the first series given hereinabove, provision may be made that the stop piece is formed of a material with the cooling member; what this wording means is that the stop piece is of one piece with such or another part of the cooling member, which means to say that the stop piece and the cooling member cannot be dissociated without destroying one and/or other of them; as a result, the stop piece is not an added-on part separate from the cooling member and also needing to be fixed on;

the stop piece is a piece separate from the cooling member, for example made of an elastic material, notably of a plastic foam;

the stop piece is arranged between two heat-sink walls of the one same fin, and is able to come into contact with at least one of the two walls when this fin is brought elastically closer to another fin;

the stop piece is formed of a material with a heat-sink wall of one of the fins and extending toward the other fin; it will be appreciated that, in this case, the stop piece extends as an orthogonal projection from the plane defined by the heat-sink wall;

the stop piece is formed of a material with the connection portion of one of the fins;

the stop piece has the form of a finger prolonging the connection portion so as to extend between two fins or between two heat-sink walls of the one same fin: what is meant by finger is a protuberance projecting from the connection portion which has dimensions smaller than those of the connection portion, notably in the transverse direction defining the direction of the series of fins and connection portions;

the stop piece prolongs the connection portion from a lateral edge thereof, substantially parallel to the heat-sink wall along which the stop piece extends;

the stop piece extends in a direction orthogonal to the plane defined by the connection portion of the associated fin, notably by a bend with this connection portion, or alternatively it extends in the plane defined by the connection portion of the associated fin;

the stop piece is formed by a bent-over corner of the connection portion.

The invention also relates to a motor vehicle headlamp comprising a lighting module as has just been described, and notably to a headlamp comprising a housing and a closing outer lens defining a space in which to house at least one lighting module.

Further features and advantages of the present invention will become more clearly apparent with the aid of the description and drawings among which:

Figure 2:
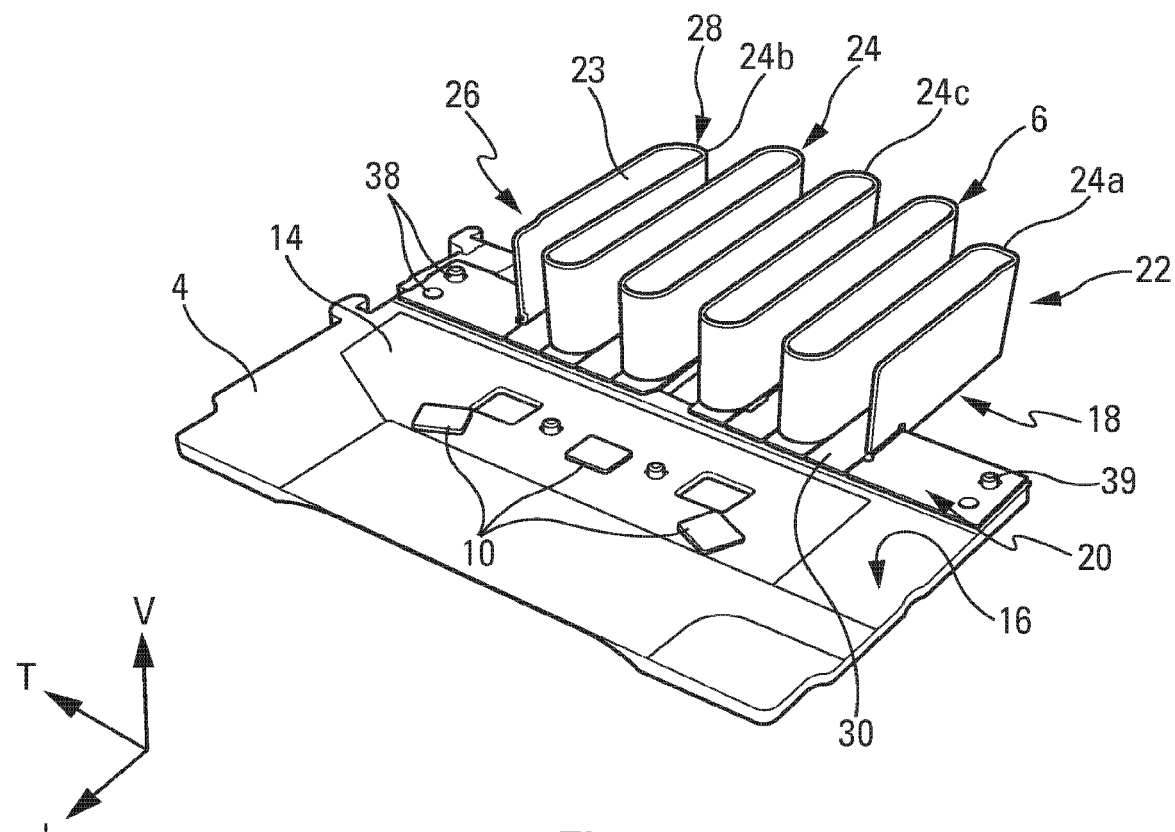
FIG. 2 is a perspective depiction of part of a lighting module according to the invention, comprising a base, three light sources and a cooling member.

In the description which follows a longitudinal, vertical and transverse orientation will be adopted nonlimitingly according to the orientation traditionally used in motor vehicles and illustrated by the L,V,T trihedral reference frame in FIG. 2. In addition, the terms lower and upper are to be interpreted in the light of the position of the lighting module in the motor vehicle when this module is in the normal position of use.

Figure 1:
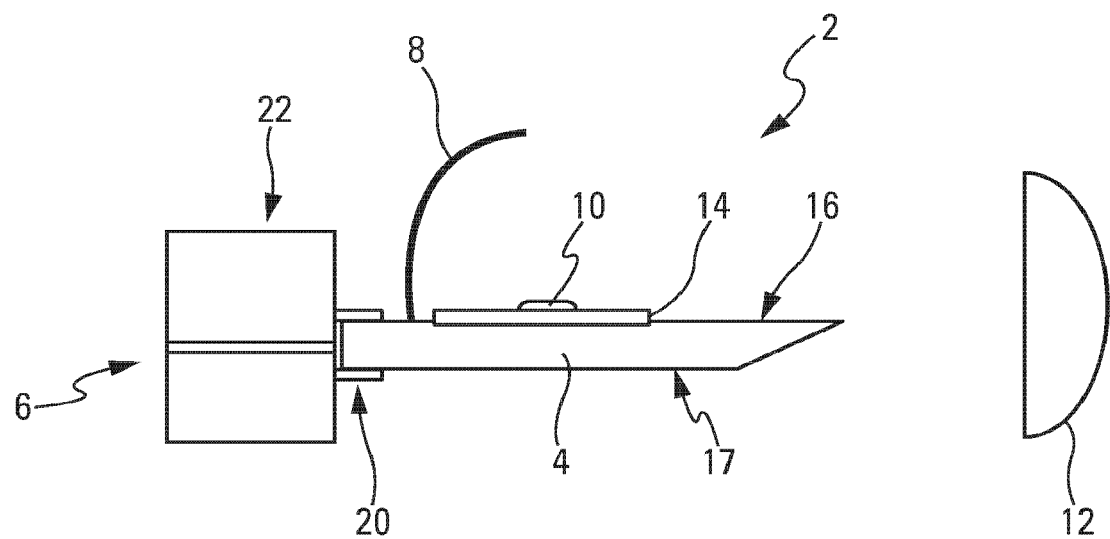
FIG. 1 is a schematic view in cross section of a lighting module according to one embodiment of the invention, and illustrating a support base supporting a light source and two cooling members, together with a reflector reflecting the rays emitted by the source toward a lens.

FIG. 1 depicts a lighting module 2 intended to be fixed in a housing (not depicted) of a motor vehicle headlamp.

The module comprises a base 4 to which are attached at least a cooling member 6, a light reflector 8, and one or more light sources 10, in this instance consisting of light emitting diodes 10. The light source 10 is positioned facing the light reflector 8 so that the rays of light emitted by the source are directed toward this reflector so that it can deflect them toward an optical element 12, in this instance in the form of a lens.

It will be appreciated that, without departing from the scope of the invention, it might be possible to propose a lighting module with beam-shaping optics different from the one depicted here, formed by the reflector and the lens.

The light source 10 may be mounted on a printed circuit board 14, the whole being supported by the base 4. The cooling member 6, the function of which is to dissipate the heat produced by the light source 10, is also arranged on this base 4, substantially in the vicinity of the light source 10. FIG. 1 illustrates two cooling members positioned facing one another on each side of the plane defined by the base 4. In what follows, just one cooling member will be illustrated and described, but, symmetrically, two cooling members may be fixed to the base.

It will be appreciated that the base 4 has a function of mechanically supporting the light source 10 and the cooling member 6 also and that it contributes to the transfer of the heat produced by the light source in operation to the cooling member 6 of which the form, described hereinafter, allows heat to be removed away from the light source.

FIG. 2 illustrates an embodiment in which the base 4 supports three light emitting diodes and the cooling member 6.

The base 4 has a substantially flat plate shape, with a first face 16 and an opposite second face 17. At a first longitudinal end of the base fixing means are provided for immobilizing the cooling member, whereas the opposite longitudinal end of the base may have a chamfered shape to form an edge to cut off the rays emitted by the source and deflected by the reflector.

The cooling member 6 is fixed at the first longitudinal end of the base 4 so that a first part 18 of the cooling member 6 has no contact with the base 4. This particular configuration makes it possible to increase the surface area of the cooling member 6 that can exchange with the surrounding air.

The first face 16 is configured to accept the light source or sources 10 and the printed circuit board. In the example depicted in FIG. 2, it is to this first face 16 that the cooling member 6 is fixed near the light source 10, but as specified earlier, it is possible to provide for a second cooling member to be fixed to the second face symmetrically with respect to the first cooling member, or indeed it is possible to provide for just one cooling member to be provided, but fixed to the second face.

The cooling member 6 comprises a fixing part 20 and a heat-dissipating heat-sink part 22. These two parts 20, 22 form a one-piece assembly, which means to say that they are produced as a single piece and cannot be separated without causing one or other to break.

The cooling member is arranged with respect to the base in such a way that the fixing part overlaps the base, so as to allow a layer of glue, which acts as a thermal interface, to be applied between the fixing part and the base, and so that the heat-sink part 22 is in part not in contact with the base 4.

The cooling member is formed by bending a single piece of sheet metal, the bending notably forming a concertina-like assembly for the heat-dissipating heat-sink part 22. The material used to obtain this metal sheet may notably be aluminum.

The cooling member 6 comprises a plurality of heat-sink walls 23, connected in pairs to form a fin 24. These heat-sink walls 23 are substantially mutually parallel. The cooling member comprises at least two fins and, in the case illustrated, comprises five fins respectively formed by two heat-sink walls.

Each heat-sink wall and the fin that it contributes to forming has a proximal part 26, facing toward the fixing part 20 and toward the base 4, and a distal part 28 forming a free end some distance away from the base. The proximal part 26 of each heat-sink wall bears a connection portion 30 which prolongs the heat-sink wall substantially at right angles and which will be described in greater detail hereinafter, the connection portions together forming the fixing part 20. It may be seen that the proximal part has a height, which means to say a dimension in the vertical direction, that is smaller than the height of the distal part so that a shoulder 32 delineates these distal and proximal parts of the heat-sink wall. It may be noted that the shoulder 32 is intended to butt against the thickness of the base 4 to make it easier for the cooling member 6 to be brought into and held in position on the base 4.

The cooling member takes the form of a metal sheet bent in several zones along substantially vertical axes of bending A-A, which means to say axes substantially perpendicular to the longitudinal main direction of elongation of the heat-sink walls and substantially perpendicular to the plane of extension defined by the first face 16 of the base 4. This succession of axes of bending defines a series of fins following on from one another in the transverse direction.

Within this plurality of bending zones it is notably possible to distinguish first bends 33 connecting two successive fins 24 together at the proximal end 26 of the heat-sink walls 23 of which they are composed, and second bends 34 joining together two heat-sink walls of one and the same fin, at their distal end 28. The alternation of first bend and second bend thereby defines a serpentine shape from a first heat-sink wall 23a positioned at one transverse end of the cooling member as far as a second heat-sink wall 23b positioned at an opposite transverse end of the cooling member.

The plurality of fins juxtaposed in transverse series provides a large surface area for exchange with the surrounding air allowing the heat energy arriving from the base 4 to be dissipated quickly to the cooling member 6.

Within this plurality of fins 24 that makes up the heat-sink part 22, two exterior fins 24a, 24b may be seen, these being arranged at each of the transverse ends of the cooling member and here having a longitudinal dimension smaller than that of the other fins that they surround, as well as a central fin 24c.

Figure 3:
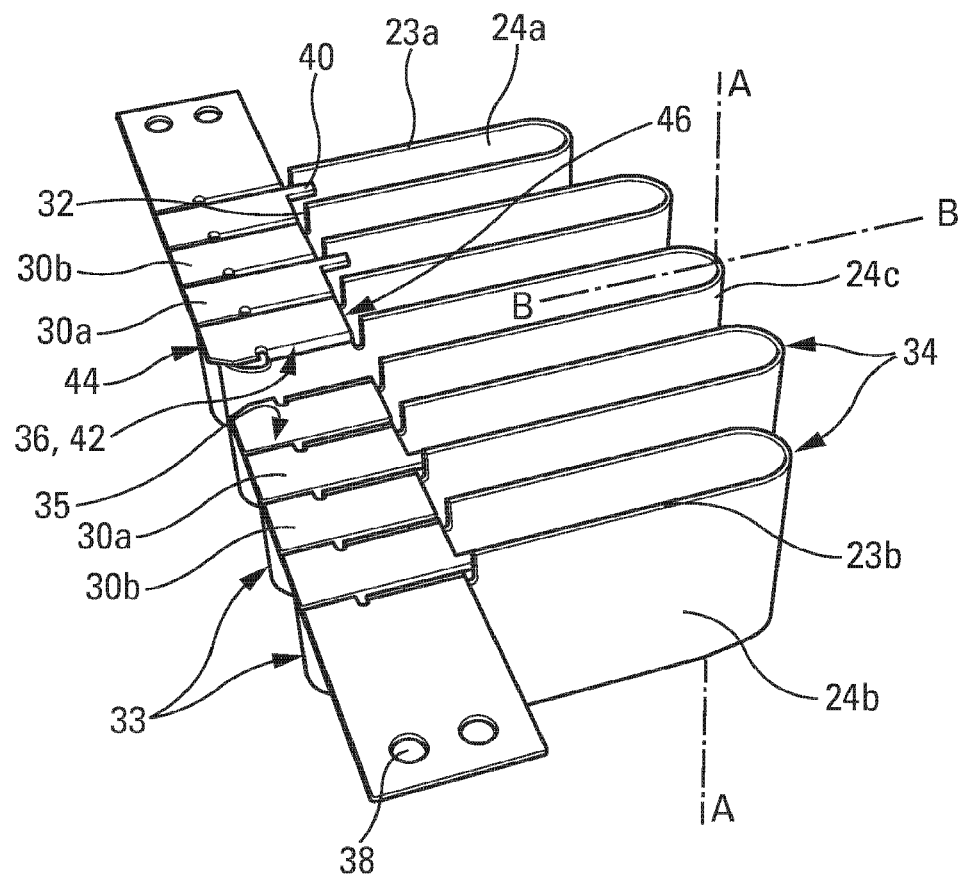
FIG. 3 is a perspective view of a cooling member according to a first embodiment of the invention.
Figure 4:
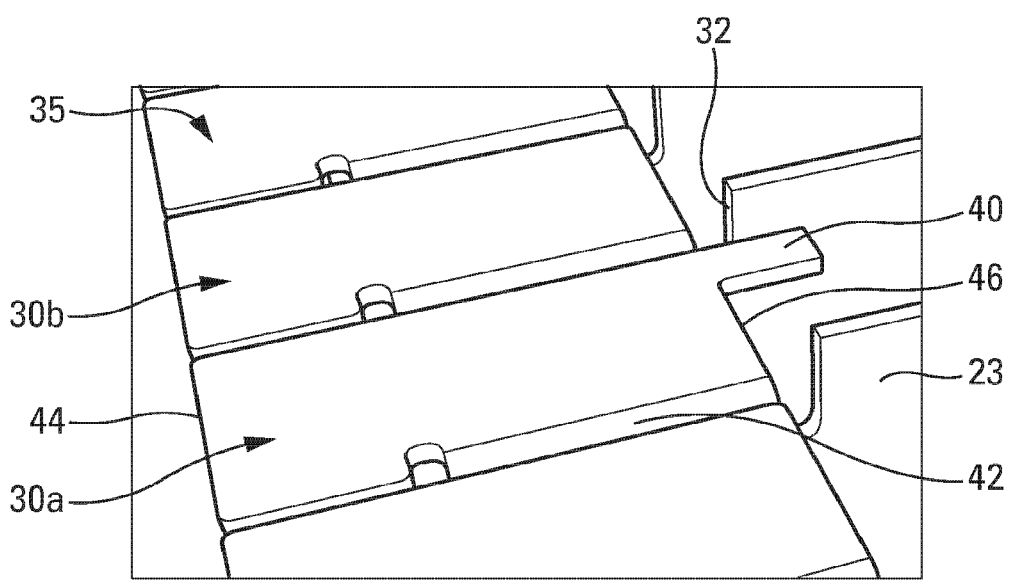
FIG. 4 is a detailed view of the cooling member of FIG. 3, in order notably to show a stop piece arranged between two heat-sink walls of the cooling member.
Figure 5:
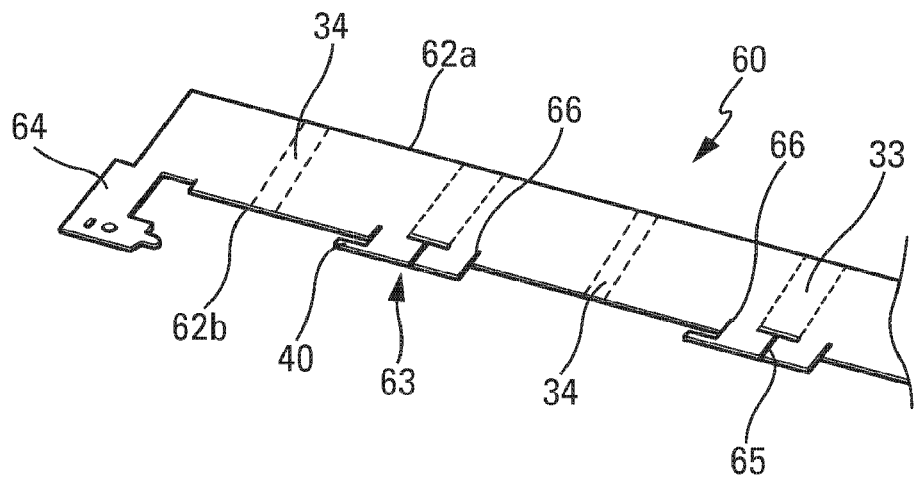
FIG. 5 is a depiction of the unbent metal sheet used to obtain the cooling member of FIG. 3.

The heat-sink part 22 is attached to the base 4 by the fixing part 20 formed of several mutually distinct connection portions 30. These connection portions 30 each have a first fixing face 35 intended to be attached against the base 4 and the fact that the connection portions are arranged in a transverse series substantially in the same plane places the connection portions in a transverse fixing band. The first fixing faces 35, visible notably in FIG. 3, are fixed to the first face 16 of the base using an adhesion means, such as glue preferably having advantageous heat transfer properties.

Each heat-sink wall 23 is prolonged by a connection portion 30 which extends substantially at right angles to this heat-sink wall, being joined together by a bend 36. The two connection portions of the one same fin are bent in the one same direction so that a first connection portion 30a is bent so that it extends substantially between the two heat-sink walls 23 of the one same fin, between the proximal end and the shoulder 32 of the heat-sink walls of this fin, and so that a second connection portion 30b is bent to extend in the same direction between a heat-sink wall of one fin and a heat-sink wall of an adjacent fin. It may be seen from the figures that the central fin 24c differs from this arrangement so that its connection portions are bent in opposite directions, each away from the fin that bears them. In that way, the central fin defines a longitudinal axis of symmetry B-B of the cooling member, an equal number of connection portions being distributed on each side of this longitudinal axis of symmetry.

Moreover, the outermost fins 24a, 24b differ from the other fins in that the second connection portion that they bear, namely the connection portion that is bent in the direction away from the fin, bears first indexing means 38. These first indexing means may consist of orifices configured to collaborate with second indexing means borne by the base, and notably the posts 39. As was specified earlier, alignment between the posts 39 and the orifices of the first indexing means 38 can be obtained by pressure applied to the fins of the cooling member. The elastic connection between the fins, obtained through the presence of the bending zones, allows the fins to move closer together, or at the very least allows the heat-sink walls of one and the same fin to move closer together.

In order to ensure that the plane defined by the arrangement of the first fixing faces of the connection portions is perfectly flat, and thus ensure a zone of contact between the cooling member and the base which is constant in thickness in order notably to ensure uniformity of heat exchange, provision is made according to the invention for a stop piece 40 to be positioned facing part of a fin, notably so as to prevent connecting portions from overlapping one another.

In what follows, a first embodiment will be described notably with reference to FIGS. 3 to 7, in which embodiment the stop piece 40 is formed as a projection of a connection portion 30. Provision is thus made for the connection portions, or at the very least for at least one of them, to be equipped with a stop piece configured to come into contact with a heat-sink wall 23.

Each connection portion has the shape of a rectangular element with one lateral edge 42 in common with the heat-sink wall, which corresponds at least in part with the bend 36, and two edges perpendicular to this lateral edge one of them being a front longitudinal end edge 44 facing toward the light source and one being a rear longitudinal end edge 46 facing toward the fins.

The stop piece 40 prolongs the connection portion 30 from the rear longitudinal end edge 46 so as to extend between two heat-sink walls. In the embodiment illustrated, with the exception of the central fin 24c, each fin 24 bears a stop piece 40 projecting to prolong the first connection portion 30a borne by the fin, namely the connection portion that is bent in such a way as to extend between the two heat-sink walls 23 of the fin. It will therefore be understood that the stop piece 40 has the effect of pressing against a heat-sink wall 23 on the inside of the corresponding fin 24 when the plurality of fins is elastically deformed. Provision could be made for each connection portion to be equipped with a stop piece, but in instances in which just one connection portion of a fin is so equipped, provision will advantageously be made for it to be the first connection portion that is equipped with the stop piece, notably so as to allow the outermost fins to be equipped with such a stop piece as these moreover have to bear the indexing means.

The stop piece 40 prolongs the connection portion and is formed of a material with this connection portion, in the same plane defined by this connection portion. While alternative forms may be envisioned in which the stop piece is bent to extend substantially at right angles to the plane defined by the associated connection portion, it is advantageous here to have an arrangement in which the stop piece is in planar continuity with the connection portion, so as to avoid a bending zone that could weaken the stop piece when it comes into abutment with the heat-sink wall.

The stop piece adopts the form of a finger extending from the rear longitudinal end edge 46 of the connection portion, in the prolongation of the free lateral edge, which means to say the opposite lateral edge to the lateral edge 42 in common that defines the bend 36 between the connection portion 30 and the heat-sink wall 23. The result of this is that the stop piece is not centered in the middle of the fin, between the two heat-sink walls, but extends near one of the two heat-sink walls, ready to come into contact with this wall as soon as the fins are elastically deformed.

It will be understood that this stop piece 40 makes it possible to prevent adjacent connection portions 30 from becoming superposed or overlapped with one another. The stop piece 40 is intended to come into contact with a heat-sink wall 23 of a fin 24 in order to limit the travel of the connection portion as two fins are brought elastically closer together.

As has been specified, the cooling member is formed of a bent metal sheet. One method of obtaining the cooling member 6 by bending will now be described notably with reference to FIG. 5 which depicts an unbent part of the metal sheet, the bending lines being depicted in order to make the manufacturing steps easier to understand. It will be appreciated that the cooling member 6 is formed of a single piece 60 of sheet metal, which starts out flat, of substantially longitudinal shape and delimited by two longitudinal edges 62.

A first longitudinal edge 62a extends in a straight line, while the opposite second longitudinal edge 62b has cutouts 63 configured to form, after bending, the connection portions 30. A special cutout 64 is produced at each transverse end of the non-bent metal sheet to form the connection portion that bears the first indexing means.

The cutouts 63 take the form of two substantially L-shaped facing portions extending one another, which project out from the second longitudinal edge 62b and are separated at their free end by a slot 65 parallel to the axis of the first bends 33. Notches 66 are formed where the second longitudinal edge and the base of each of the portions meet, to facilitate the subsequent bending of the connection portions.

The zones corresponding to the first 33 and second 34 bends extend from one longitudinal edge 62 to the other.

The fins are successively formed one after another by placing a roller against the sheet metal in the various zones and by folding the heat-sink walls over to face one another. After this first bending step, a series of fins has been produced, for each of which fins the cutouts 63 are still in the same plane as the heat-sink walls 23.

Figure 6:
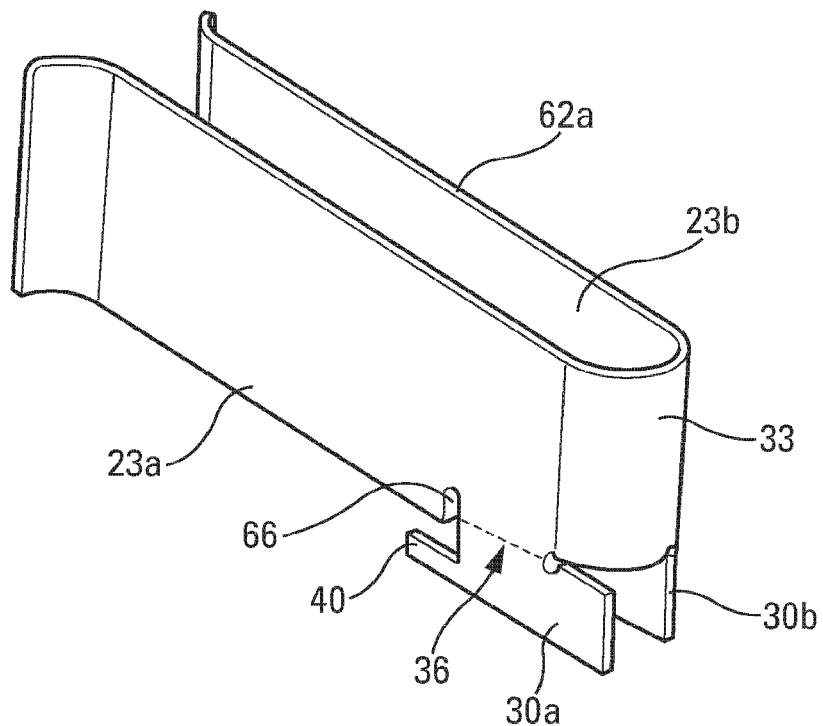
FIGS. 6 and 7 are steps in the method of obtaining the cooling member of FIG. 3 by bending.

FIG. 6 illustrates two heat-sink walls 23 parallel to one another, with a first heat-sink wall 23a forming part of a first fin and a second heat-sink wall 23b forming part of a second fin directly adjacent to the first fin. The two fins are joined by a first bend 33 near which the connection portions extend. Here there is a first connection portion 30a prolonging the first heat-sink wall 23a and bearing a finger to form a stop piece 40, and a second connection portion 30b prolonging the second heat-sink wall 23, without a stop piece. As has already been specified, the connection portions at this stage lie in the plane defined by the heat-sink wall that they respectively prolong.

Figure 7:
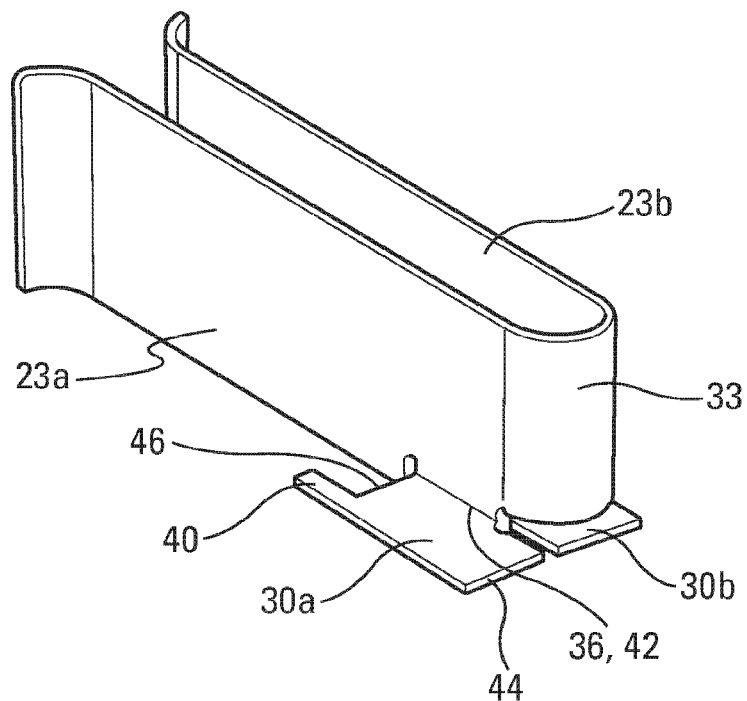

The connection portions are then bent along the bends 36 to fold them over and bring them substantially orthogonal to the heat-sink wall that they respectively prolong. As illustrated in FIG. 7, these connection portions are folded over in the same direction, so that the first connection portion 30a bearing the stop piece extends between two heat-sink walls of the one same fin and so that the second connection portion 30b, which in this instance has no stop piece, extends between one heat-sink wall of one fin and a heat-sink wall of a second fin.

The bending of the connection portions is made easier by the presence of the notches which, when the cooling member is assembled, form the shoulders 32 between the proximal part 26 and the distal part 28 of the heat-sink walls 23.

According to the invention, the connection portions 30 are configured to form a planar fixing surface for increasing the surface area of contact with the base. Advantageously, the connection portions 30 are adjacent but do not overlap because of the presence of the stop pieces 40 which limit the movement of the fins 24 relative to one another when transverse pressure is applied to them at the time of the positioning of the cooling member on the base. This then prevents plastic deformation of the connection portions 30 and ensures constant spacing between the fixing faces of the connection portions and the face of the base against which these connection portions are pressed, and therefore a constant thickness of glue. Thus, transfer of heat between the base 4 and the heat-sink part 22 of the cooling member 6 is improved because of a uniform distribution of the glue.

Alternative forms of embodiment may be provided for without the context of the invention changing, providing that the stop pieces are provided facing part of the fin so as to come into contact therewith when at least two fins are brought elastically closer together. By way of nonlimiting example, provision may be made that:

the fins are formed of a single heat-sink wall and only first bends are provided;

the stop pieces extend in a direction perpendicular to the plane defined by the connection portions;

at least one stop piece is formed of a material with a heat-sink wall of one of the fins, extending toward an adjacent fin;

the stop pieces are formed by an attached component fixed to the connection portion or to the heat-sink wall.

Figure 8:
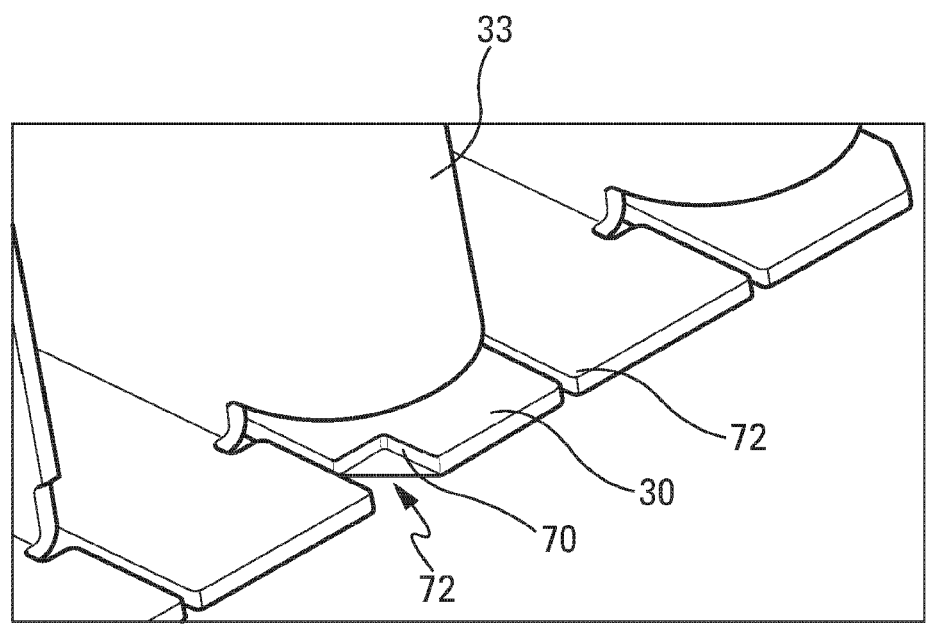
FIG. 8 is a detailed view of a cooling member according to a second embodiment of the invention.

FIG. 8 illustrates another alterative form of embodiment whereby the stop piece is created by bending 70 over a corner 72 of the connection portion, and notably a corner facing an adjacent connection portion. In that way, the stop piece does not extend in the plane defined by the connection portions and forms a limit stop to the overlapping of these adjacent connection portions, it being impossible for the connection portion bearing the stop piece to slip under the connection portion facing which the stop piece extends. According to the invention, the stop piece is able to come into contact with part of the fin, namely the connection portion.

The invention claimed is:

1. A lighting module, comprising:
a base on which is mounted at least one light source; and
a cooling member including at least two fins joined together elastically, each of the at least two fins including
at least one heat-sink wall, and
a connection portion, thermally connected to the base by a thermal interface, having a front surface defining a front plane orthogonal to the base and a rear surface defining a rear plane parallel to the front plane,
wherein the at least one heat-sink wall of each of the at least two fins transcends the rear plane of the connection portion, and
wherein at least one stop piece is arranged to be in contact with at least one heat-sink wall of a first fin of the at least two fins when the first fin is brought elastically closer to a second fin of the at least two fins, the at least one stop piece extending from a connection portion of the first fin and across a rear plane of the connection portion of the first fin.

2. The lighting module according to claim 1, wherein the cooling member is formed of a single piece of bent sheet metal.

3. The lighting module according to claim 2, wherein the first fin and the second fin are joined together elastically by a first bend.

4. The lighting module according to claim 2, wherein each of the at least two fins includes two heat-sink walls.

5. The lighting module according to claim 2, wherein the connection portion of each of the at least two fins prolongs a corresponding at least one heat-sink wall via a bend.

6. The lighting module according to claim 2, wherein the at least one stop piece is formed integrally with the cooling member.

7. The lighting module according to claim 2, wherein the at least one heat-sink wall of each of the at least two fins is two heat-sink walls and the at least one stop piece is arranged between the two heat-sink walls of the first fin of the at least two fins, the at least one stop piece being configured to come into contact with one or more of the two heat-sink walls when the one fin is brought elastically closer to the second fin.

8. The lighting module according to claim 1, wherein the first fin and the second fin are joined together elastically by a first bend.

9. The lighting module according to claim 8, wherein the first bend joining the first fin to the second fin prolongs an end of a heat-sink wall of each of the first fin and the second fin.

10. The lighting module according to claim 1, wherein each of the at least two fins includes two heat-sink walls.

11. The lighting module according to claim 10, wherein the two heat-sink walls of each of the at least two fins are joined together by a second bend, a first bend joining the at least two fins and the second bend being arranged at opposite ends of the cooling member.

12. The lighting module according to claim 1, wherein the connection portion of each of the at least two fins prolongs a corresponding at least one heat-sink wall via a bend.

13. The lighting module according to claim 1, wherein the at least one stop piece is formed integrally with the cooling member.

14. The lighting module according to claim 1, wherein the first fin of the at least two fins includes two heat-sink walls and the at least one stop piece is arranged between the two heat-sink walls of the first fin, the at least one stop piece being configured to come into contact with one or more of the two heat-sink walls when the first fin is brought elastically closer to the second fin.

15. The lighting module according to claim 1, wherein the at least one stop piece is formed integrally with one of the at least one heat-sink wall of the first fin of the at least two fins and extends toward the second fin of the at least two fins.

16. The lighting module according to claim 1, wherein the at least one stop piece is formed integrally with the connection portion of the first fin of the at least two fins.

17. The lighting module according to claim 1, wherein the at least one stop piece has the form of a finger prolonging the connection portion so as to extend between the first fin and the second fin or between two heat-sink walls of each of the first fin and the second fin.

18. The lighting module according to claim 17, wherein the at least one stop piece prolongs the connection portion from a lateral edge thereof, substantially parallel to a heat-sink wall of the two heat-sink walls along which the at least one stop piece extends.

19. The lighting module according to claim 17, wherein the at least one stop piece extends in a plane defined by the connection portion of a corresponding fin.

* * * * *